United States Patent
Miyata et al.

(10) Patent No.: US 7,276,386 B2
(45) Date of Patent: Oct. 2, 2007

(54) SEMICONDUCTOR DEVICE AND METHOD OF MANUFACTURING THE SAME

(75) Inventors: Katsumi Miyata, Aizuwakamatsu (JP); Eiji Watanabe, Kawasaki (JP); Hiroyuki Yoda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 233 days.

(21) Appl. No.: 10/914,235

(22) Filed: Aug. 10, 2004

(65) Prior Publication Data

US 2005/0006792 A1    Jan. 13, 2005

Related U.S. Application Data

(62) Division of application No. 09/478,508, filed on Jan. 6, 2000, now abandoned.

(30) Foreign Application Priority Data

Apr. 26, 1999    (JP) .................................. 11-118543

(51) Int. Cl.
*H01L 21/00* (2006.01)
*H01L 21/44* (2006.01)

(52) U.S. Cl. .................. 438/11; 438/614; 438/653; 438/654; 438/656; 438/674; 438/686

(58) Field of Classification Search ................ None
See application file for complete search history.

(56) References Cited

U.S. PATENT DOCUMENTS

| | | | |
|---|---|---|---|
| 4,922,322 A * | 5/1990 | Mathew | 257/737 |
| 5,130,275 A * | 7/1992 | Dion | 438/614 |
| 5,277,756 A * | 1/1994 | Dion | 438/754 |
| 5,461,261 A * | 10/1995 | Nishiguchi | 257/781 |
| 5,508,229 A * | 4/1996 | Baker | 438/614 |
| 5,597,737 A * | 1/1997 | Greer et al. | 438/17 |
| 5,719,070 A | 2/1998 | Cook et al. | |
| 5,793,117 A * | 8/1998 | Shimada et al. | 257/780 |
| 5,821,627 A | 10/1998 | Mori et al. | 257/780 |
| 6,111,317 A | 8/2000 | Okada et al. | 257/737 |
| 6,117,299 A * | 9/2000 | Rinne et al. | 205/125 |
| 6,162,718 A * | 12/2000 | Boettcher | 438/613 |
| 6,268,114 B1 * | 7/2001 | Wen et al. | 430/314 |
| 6,440,836 B1 * | 8/2002 | Lu et al. | 438/612 |
| 6,512,256 B1 * | 1/2003 | Cuchiaro et al. | 257/295 |

FOREIGN PATENT DOCUMENTS

| JP | 2-94442 | 4/1990 |
|---|---|---|
| JP | 9-148331 | 6/1997 |
| JP | 2000-294605 | 10/2000 |

* cited by examiner

*Primary Examiner*—David E. Graybill
(74) *Attorney, Agent, or Firm*—Westerman, Hattori, Daniels & Adrian, LLP.

(57) ABSTRACT

A method of manufacturing a semiconductor device includes the steps of forming barrier metals on first electrodes provided on a chip of the semiconductor device, implementing a predetermined test on the semiconductor device by applying a signal to the semiconductor device via at least one of the barrier metals, and forming second protruded electrodes on the barrier metals. The predetermined tests are implemented before forming second protruded electrodes on the barrier metals.

11 Claims, 11 Drawing Sheets

FIG. 15

|  |  | METERIAL OF PROBE | | |
|---|---|---|---|---|
|  |  | Au | Pd | W |
| THIRD CONDUCTIVE MERTAL LAYER | Cu | Au | Pd  Au | Au  Ag<br>Pt  Rh  Pd |
|  | Ni | Au | Pd  Au | Au  Ag<br>Pt  Rh  Pd |
|  | Pd | Au | Au  Ag<br>Pt  Rh | Au  Ag<br>Pt  Rh |

SEMICONDUCTOR DEVICE AND METHOD OF MANUFACTURING THE SAME

This application is a divisional application of prior application Ser. No. 09/478,508 filed Jan. 6, 2000 now abandoned.

BACKGROUND OF THE INVENTION

1. Field of the Invention

The present invention generally relates to a semiconductor device and a method of manufacturing the same. The present invention particularly relates to a method of manufacturing a semiconductor device provided with electrodes formed on a semiconductor substrate, barrier metals formed on respective electrodes and protruded electrodes joined to the electrodes via the barrier metals.

Recently, there is a decrease in the sizes of semiconductor devices. It is known to use protruded electrodes such as bumps as external connection terminals of the miniaturized semiconductor devices. The semiconductor devices having protruded electrodes may be a BGA (Ball Grid Array) type semiconductor device or a CSP (Chip Size Package) type semiconductor device.

Also, the semiconductor devices require higher reliability, and thus, it is necessary that protruded electrodes also realize higher reliability.

2. Description of the Related Art

FIG. 1 is a side view of an example of a semiconductor device of a related art having bumps and electrode pads. Here, FIG. 1 shows a semiconductor device 1 of a general CSP type. As shown in FIG. 1, the semiconductor device 1 has a plurality of electrode pads 3 provided on a circuit forming surface 2a of the semiconductor chip 2. Each electrode pad 3 is provided with a bump 4 which serves as an external connection terminal.

FIG. 2 is an enlarged view showing a region around the electrode pad 3 provided on the semiconductor device 1 of FIG. 1. The electrode pad 3 includes an electrode 5 and a barrier metal 10. As shown in FIG. 2, the bump 4 is not directly formed on the electrode 5, but is joined to the electrode 5 via the barrier metal 10 provided on the electrode 5. The detailed structure of the semiconductor device 1 will be described below.

The circuit forming surface 2a of the semiconductor chip 2 is provided with an insulating layer 6 for protecting the circuit forming surface 2a. The insulating layer 6 is provided with openings 7 at positions corresponding to the electrodes 5 such that the electrodes 5 are exposed via the openings 7.

The barrier metal 10 has a layered structure of a first conductive metal layer 11, a second conductive metal layer 12, and a third conductive metal layer 13. The barrier metal 10 prevents the bump 4 from diffusing into the electrode 5. For example, when the bump 4 is made of solder and a gold (Au) plating is applied on the electrode 5, and if the bump 4 is directly joined to the electrode 5, the solder will diffuse into the gold plating of the electrode 5. This causes a decrease in strength of the diffused part, which may result in the peeling off of the bump 4 from the electrode 5. The barrier metal 10 prevents the bump 4 from diffusing into the electrode 5 and thus prevents the bump 4 from being peeled off from the electrode 5.

The first conductive metal layer 11 is provided at a position nearest to the semiconductor chip 2 or at the lowermost position. This first conductive metal layer 11 is made of a material having a good joining property with the electrode 5. The second conductive metal layer 12 is provided on the first conductive metal layer 11. This second conductive metal layer 12 is made of a material having a good joining property with the first conductive metal layer 11. The third conductive metal layer 13 is provided on the second conductive metal layer 12. This third conductive metal layer 13 is made of a material having a good joining property with the second conductive metal layer 12 and the bump 4. Also, the third conductive metal layer 13 should be made of a material which can prevent the diffusion of the bump 4.

The semiconductor device 1 is manufactured in the following manner. First, the barrier metals 10 are formed. In order to manufacture the barrier metal 10, the first conductive metal layer 11 is formed on the semiconductor chip 2 such that the first conductive metal layer 11 is electrically connected to the electrode 5. Then, the second conductive metal layer 12 is laminated on the first conductive metal layer 11. Subsequently, a resist having openings corresponding to predetermined shapes of the barrier metals is formed on the second conductive metal layer 12. With this resist being provided on the second conductive metal layer, the third conductive metal layer 13 is formed. Thereafter, the resist is removed. Further, unwanted parts of the first and second conductive metal layers 11 and 12 are removed by etching. Thus, the barrier metal 10 is obtained.

The bumps 4 serving as external connection terminals are formed by transferring solder balls onto the barrier metals 10 and heating the solder balls so that the solder balls will be joined to the barrier metals 10.

After the bumps 4 have been formed as described above, a testing step is carried out. As shown in FIG. 3, probes 14 connected to a tester or a testing device (not shown) are brought in contact with the bumps 4. This may be referred to as "probing". Then, test signals from the tester are supplied to the semiconductor chip 2 via the probes 4. Thus, a predetermined test such as a reliability test or an operational test can be implemented on the semiconductor chip 2. Thereby, good semiconductor devices are selected.

With the method of manufacturing the semiconductor device of the related art, the testing step is carried out after the bumps 4 have been formed on the barrier metals 10. Therefore, the probes 14 should be connected to the bump 4. However, it is difficult to properly connect the probe 14 to the bump 4 having a spherical shape. Also, according to the recent miniaturization of the semiconductor device 1, further fine-pitched structures, such as an area array, have been introduced. Then, there arises a problem that it is even more difficult to properly connect the probe 14 to the bump 4 having a spherical shape.

Also, when the probe 14 is directly probed on the bump 4, the material of the bump 4 will adhere to the tip part of the probe 14. Examples of the material forming the bump 4 may be tin (Sn) or lead (Pb). On the other hand, generally, the tip part of the probe 14 is provided with a plated part 15. For example, when the probe 14 is made of palladium (Pd), the plated part 15 may be of gold.

It is well known that tin reacts with gold. Therefore, if the material of the bump 4 adheres onto the tip part of the probe 14, the probe 14 will be degraded over a several usage. This results in a drawback that the reliability of the testing step is reduced. Also, there is a drawback that the testing cost increases since a frequent replacement of the costly probes 14 is necessary.

SUMMARY OF THE INVENTION

Accordingly, it is a general object of the present invention to provide a method and a device of manufacturing a semiconductor device which can overcome the drawbacks described above.

It is another and more specific object of the present invention to provide method and a device of manufacturing a semiconductor device which can improve the reliability of the testing step while reducing the cost of the testing step.

In order to achieve the above objects according to the present invention, a method of manufacturing a semiconductor device includes the steps of:

a) forming barrier metals on first electrodes provided on a chip of the semiconductor device;

b) implementing, after the step a), a predetermined test on the semiconductor device by applying a signal to the semiconductor device via at least one of the barrier metals; and c) forming, after the step a), second protruded electrodes on the barrier metals.

With the method described above, connection terminals (e.g., probes) for testing used in the testing step are not connected to the spherical protruded electrodes but connected to the barrier metal having substantially flat surfaces. Therefore, the connection terminals for testing can be securely connected to the barrier metals.

It is still another object of the present invention to provide method and a device of manufacturing a semiconductor device which can reduce the cost of the testing step while improving the reliability of the testing step. Thereby, reliability test such as an electric test and a burn-in test can be implemented with a high reliablity.

In order to achieve the above object, the step a) includes a step of forming the barrier metals each having a multilayer structure having uppermost conductive metal layer which is made of a material which can be alloyed with a material of the second protruded electrodes and has a resistance to reaction and adhesion with a material of probes used for the step b) and with a material of plated parts provided on the probes.

With the above structure, the reliability of the test can be improved and there is no need for a frequent replacement of costly probes.

Other objects and further features of the present invention will be apparent from the following detailed description when read in conjunction with the accompanying drawings.

BRIEF DESCRIPTION OF THE DRAWINGS

FIG. 15 is a chart showing combinations of materials of the probe and the third conductive metal layer and possible materials of the fourth conductive metal layer.

DETAILED DESCRIPTION OF THE PREFERRED EMBODIMENTS

In the following, principles and embodiments of the present invention will be described with reference to the accompanying drawings.

Figure 1:
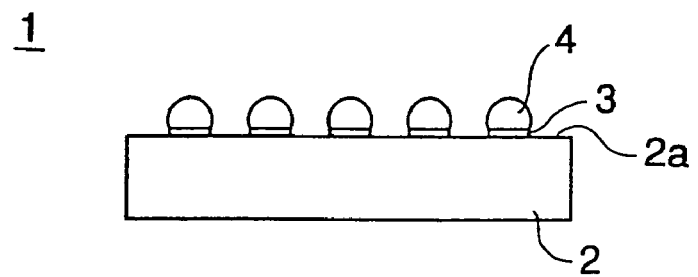
FIG. 1 is a side view of an example of a semiconductor device of a related art having bumps and electrode pads.
Figure 2:
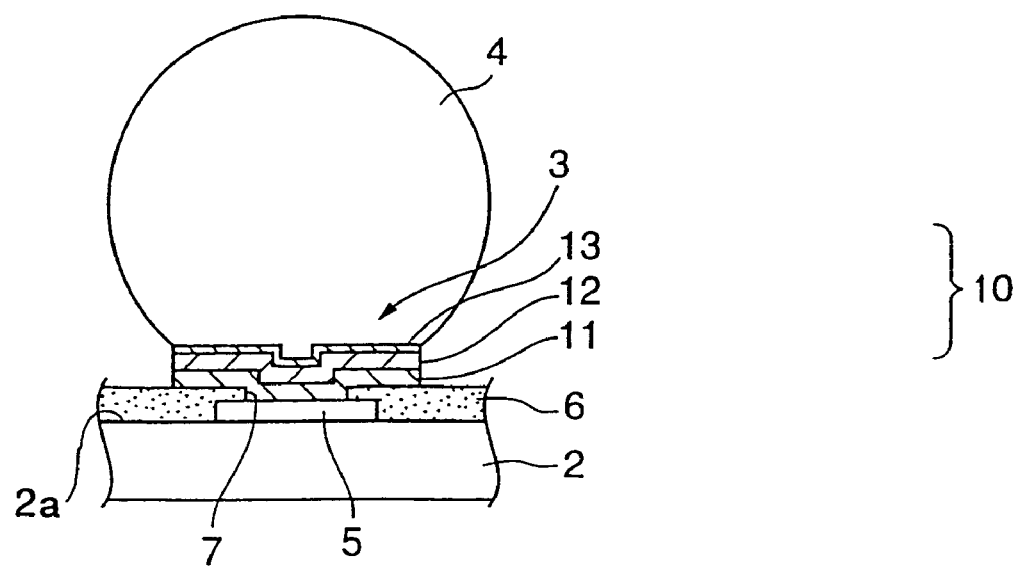
FIG. 2 is an enlarged view showing a region around the electrode pad provided on the semiconductor device of FIG. 1.
Figure 3:
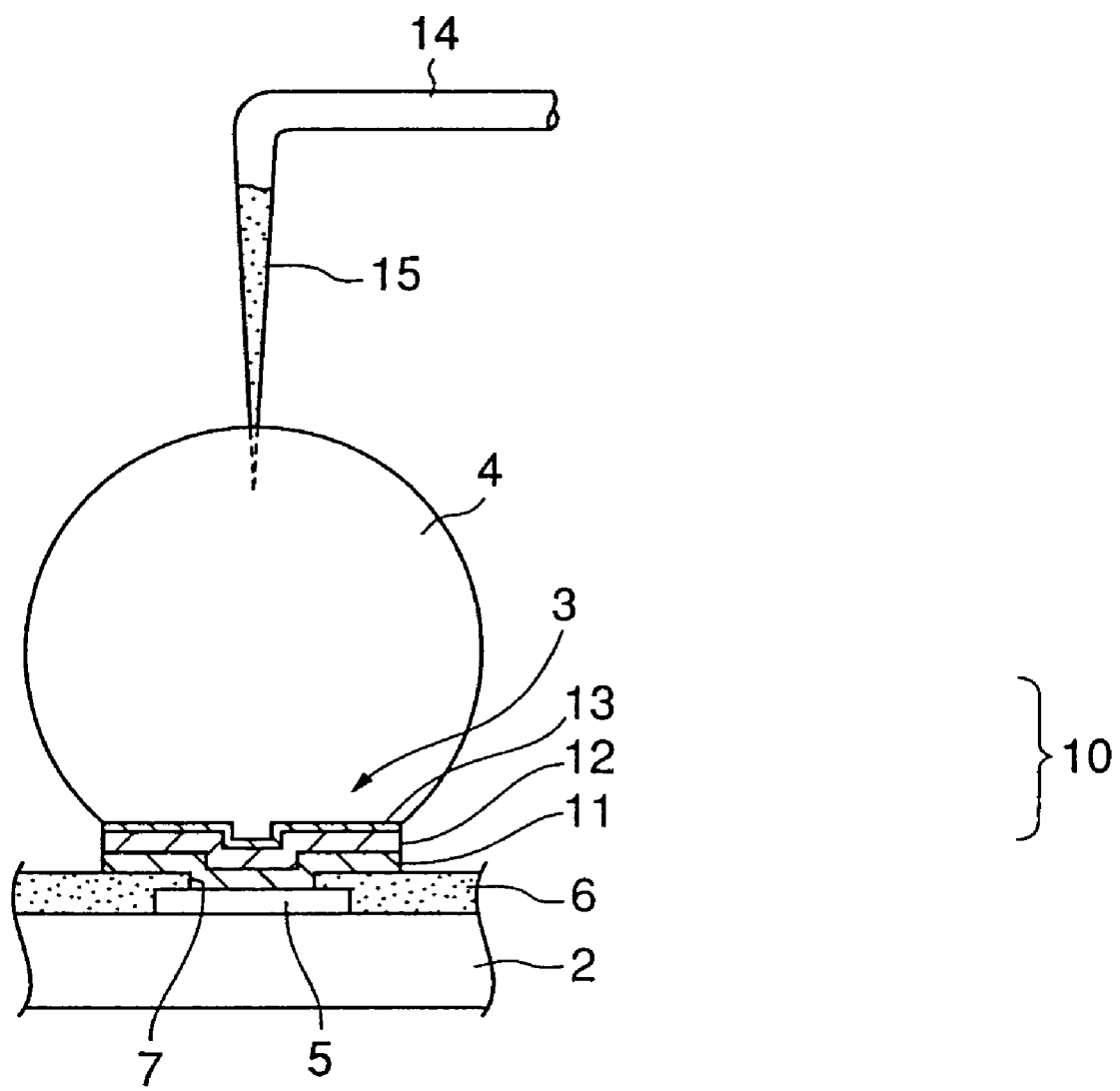
FIG. 3 is diagram showing a testing step carried out in a method of manufacturing a semiconductor device of the related art.

FIGS. 4 to 15 are diagrams illustrating a manufacturing method of a semiconductor device 20 of a first embodiment of the present invention. In FIGS. 4 to 9, components similar to those shown in FIGS. 1 to 3 are indicated with similar reference numerals.

Figure 14:
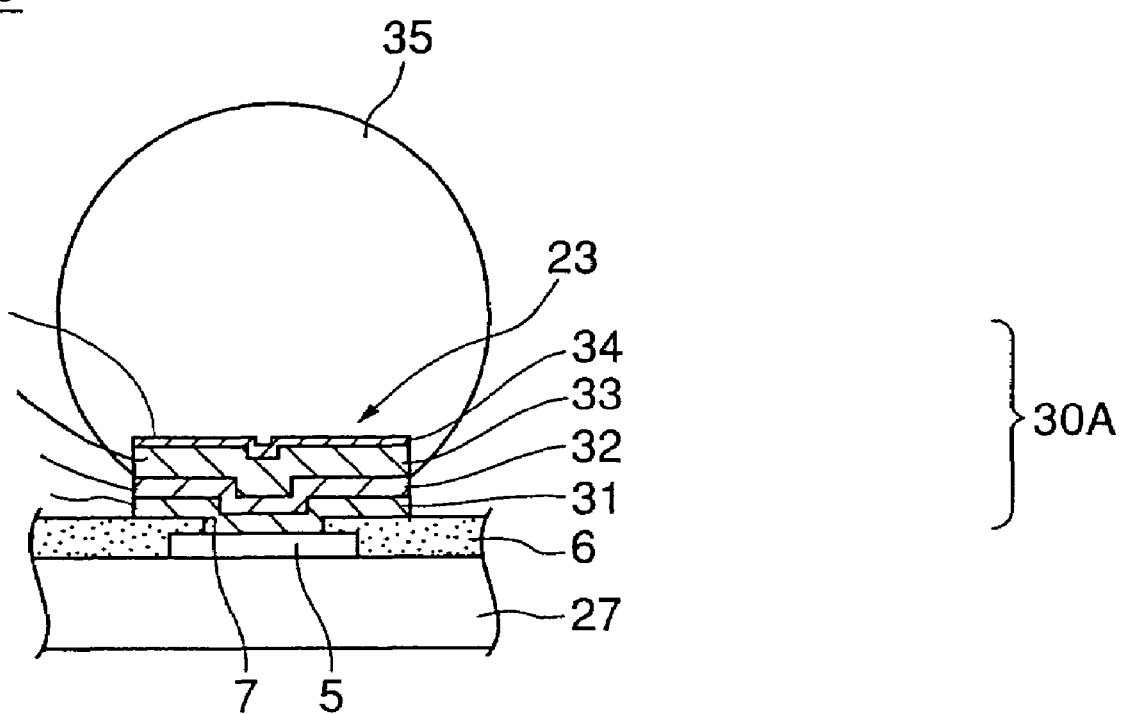
FIG. 14 is an enlarged view showing a region around the electrode pad provided on the semiconductor device of a first embodiment of the present invention.

First of all, for the sake of convenience, a structure of the semiconductor device 20 to be manufactured will be described in detail. FIG. 14 is an enlarged view showing a region around an electrode pad 23 provided on the semiconductor device 20 of a first embodiment of the present invention.

Referring to FIG. 14, the electrode pad 23 provided on the semiconductor device 20 includes an electrode 5 formed on a semiconductor chip 27 and a barrier metal 30A formed on the electrode 5. The barrier metal 30A provided on the semiconductor device 20 of the present embodiment has a layered structure of a first conductive metal layer 31, a second conductive metal layer 32, a third conductive metal layer 33 and a fourth conductive metal layer 34.

The first conductive metal layer 31 is layered at a position nearest to the semiconductor chip 2 so as to be joined to the electrode 5. The first conductive metal layer 31 may also be referred to as a lowermost conductive metal layer. This first conductive metal layer 31 is made of a material having a good joining property with the electrode 5. In the present embodiment, the first conductive metal layer 31 is made of a material such as titanium (Ti) and has a thickness of about 500 nm.

Instead of titanium, the first conductive metal layer 31 may be made of a metal chosen from a group consisting of chromium (Cr), molybdenum (Mo) and tungsten (W), or of an alloy containing a metal chosen from a group consisting of titanium (Ti), chromium (Cr), molybdenum (Mo) and tungsten (W).

The second conductive metal layer 32 is interposed between the first conductive metal layer 31 and the third conductive metal layer 33. This second conductive metal layer 32 is made of a material having a good joining property with both the first conductive metal layer 31 and the third conductive metal layer 33. In the present embodiment, the second conductive metal layer 32 is made of a material such as nickel (Ni) and has a thickness of about 500 nm.

Instead of nickel, the second conductive metal layer 32 may be made of a metal chosen from a group consisting of copper (Cu) and palladium (Pd), or of an alloy containing a metal chosen from a group consisting of copper (Cu), nickel (Ni) and palladium (Pd).

The third conductive metal layer 33 is interposed between the second conductive metal layer 32 and the fourth conductive metal layer 34. This third conductive metal layer 33 is made of a material having a good joining property with both the second conductive metal layer 32 and the fourth conductive metal layer 34. In the present embodiment, the third conductive metal layer 33 is made of a material such as copper (Cu) and has a thickness of about 500 nm.

Instead of copper, the third conductive metal layer 33 may be made of a metal chosen from a group consisting of nickel (Ni) and palladium (Pd), or of an alloy containing a metal chosen from a group consisting of copper (Cu), nickel (Ni) and palladium (Pd).

The second conductive metal layer 32 and the third conductive metal layer 33 are interposed between the first conductive metal layer 31 (lowermost conductive layer) and the fourth conductive metal layer 34. Thus, a combination of the second conductive metal layer 32 and the third conductive metal layer 33 may also be referred to as an intermediate conductive layer.

The fourth conductive metal layer 34 is layered at a position distal from the semiconductor chip 2. The fourth conductive metal layer 34 may also be referred to as an uppermost conductive metal layer. This fourth conductive metal layer 34 is made of a material which can be easily alloyed with the material of a bump 35 and which has resistance to oxidation. In the present embodiment, the material of the bump 35 is solder. Also, the fourth conductive metal layer 34 is made of a material such as gold (Au) and has a thickness of about 0.1 μm.

Instead of gold, the fourth conductive metal layer 34 may be made of a metal chosen from a group consisting of platinum (Pt), palladium (Pd), silver (Ag) and rhodium (Rh) or of an alloy containing a metal chosen from a group consisting of gold (Au), platinum (Pt), palladium (Pd), silver (Ag) and rhodium (Rh).

In the above described structure, each one of the first to fourth conductive metal layers 31 to 34 are described as a single metal layer. However, each one of the first to fourth conductive metal layers 31 to 34 may also have a layered structure of a plurality of conductive metal layers.

The bump 35 is an example of a protruded electrode. It is to be note that the protruded electrode is not limited to a spherical ball but can also take other shapes such as a stud bump. In the present embodiment, the bump 35 serves as an external terminal and has a substantially spherical shape. Considering a secure mounting of the semiconductor device 20, the bump 35 is made of a material chosen so as to improve joining property with the mounting substrate. Thus, in the present embodiment, the bump 35 is made of solder which is an alloy of tin (Sn) and lead (Pb). For example, a solder having a Pb/Sn ratio of 95%/5% is used. The bump 35 may have a height of about 100 μm.

Instead of solder, the bump 35 may be made of a metal chosen from a group consisting of tin (Sn), lead (Pb), silver (Ag), indium (In) and bismuth (Bi) or of an alloy containing a metal chosen from a group consisting of tin (Sn), lead (Pb), silver (Ag), indium (In) and bismuth (Bi). Any of the metals and alloys may be selected, as long as the selected metal or alloy has a low melting point of less than or equal to about 350° C.

In the present embodiment, the fourth conductive metal layer 34 is made of gold (Au) which can be easily alloyed with solder used as a material of the bump 35. Thus, a metal having a good joining property with the bump 35 may be selected as a material of the fourth conductive metal layer 34, so as to improve the joining property between the fourth conductive metal layer 34 and the bump 35.

Also, the fourth conductive metal layer 34 is made of a material having a good resistance to oxidation. Therefore, even if a heat treatment is implemented after the barrier metal 30A has been formed and then the bump 35 is formed on the barrier metal 30A, an oxide layer will not be formed on the surface of the fourth conductive metal layer 34 during the heat treatment. This is advantageous since the oxide layer has a negative effect for joining the bumps. Therefore, the bump 35 can be securely joined on the barrier metal 30A, and thus the reliability of the semiconductor device 20 can be improved.

In the following, a method of manufacturing the semiconductor device 20 of the above-described structure will be described.

Although the semiconductor device 20 is manufactured through a number of steps, only those steps essential to the present invention will be described in detail. The following explanation relates to a step of forming barrier metals (barrier metal forming step), a step of forming bumps (protruded electrode forming step), and a step of testing a plurality of semiconductor chips provided on a wafer (testing step).

Figure 4:
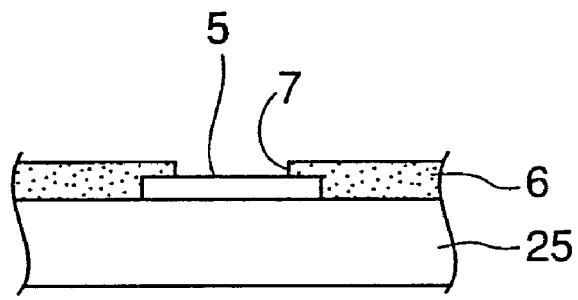
FIGS. 4 to 9 are diagrams showing various sub-steps of a barrier metal forming step of a first embodiment of a method of manufacturing a semiconductor device of the present invention.

FIGS. 4 to 9 are diagrams showing various sub-steps of the barrier metal forming step of a first embodiment of a method of manufacturing a semiconductor device of the present invention. FIG. 4 shows a part of a wafer 25 provided with the electrodes 5 and the insulating layer 6 having the openings 7 through which the electrodes 5 are exposed. It is to be noted that, as a result of other manufacturing steps, the wafer 25 has already been provided with a plurality of semiconductor chips (not shown) integrated thereon. FIG. 4 is an enlarged view showing a region at one of the electrodes 5 provided on one of the plurality of semiconductor chips formed on the wafer 25.

Figure 5:
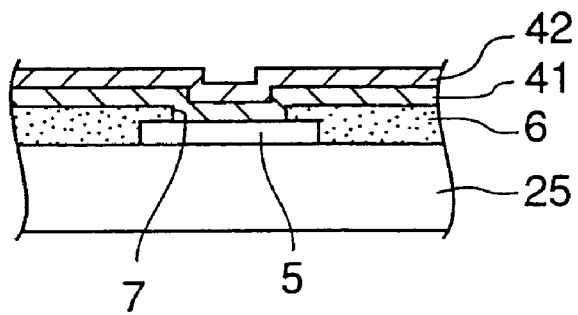

As shown in FIG. 5, first of all, a first conductive metal coating 41 is formed on the wafer 25 through a sputtering process. Then, a second conductive metal coating 42 is provided on the first conductive metal coating 41. In the present embodiment, the first conductive metal coating 41 may be made of titanium (Ti) and has a thickness of about 500 nm. The second conductive metal coating 42 may be made of copper (Cu) and also has a thickness of about 500 nm.

Figure 6:
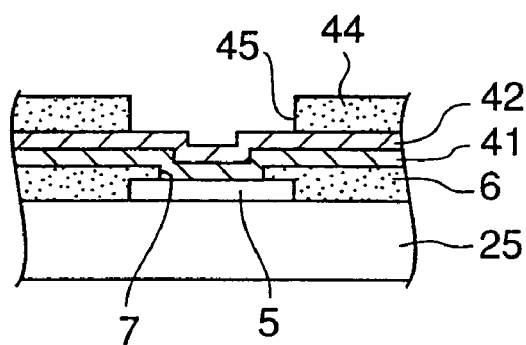

As shown in FIG. 6, after the first and second conductive metal coatings 41 and 42 have been formed, a positive resist 44 is provided on the second conductive metal coating 42. Then, the positive resist 44 undergoes an etching process so as to provide openings 45 formed at positions corresponding to the electrodes 5. The opening 45 is formed with an area greater than the area of the electrode 5.

Figure 7:
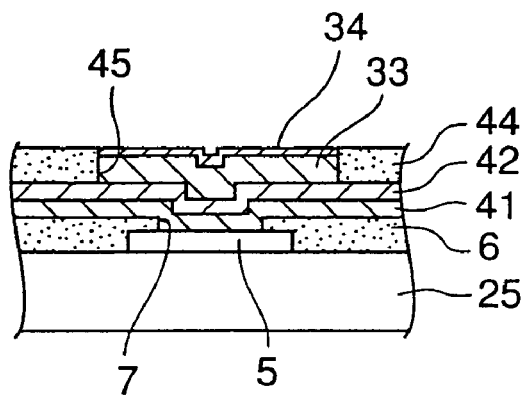
Figure 8:
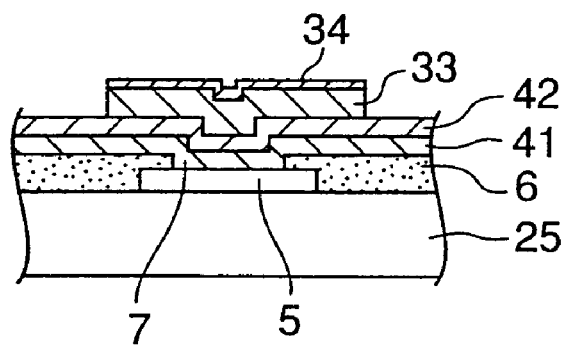

Then, an electric current is applied to the first conductive metal coating 41 or the second conductive metal coating 42. Then, an electrolytic plating process is carried out so as to provide the third conductive metal layer 33 on the second conductive metal coating 42 and to provide the fourth conductive metal layer 34 on third conductive metal layer 33. The third conductive metal layer 33 has a thickness of about 2 μm and the fourth conductive metal layer 34 has a thickness of about 0.1 μm. FIG. 7 is a diagram showing a state where the third conductive metal layer 33 and the fourth conductive metal layer 34 have been formed.

In the present embodiment, the third conductive metal layer 33 is made of nickel (Ni) and the fourth conductive metal layer 34 is made of gold (Au). Also, as has been described above, the fourth conductive metal layer 34 is a thin metal layer having a thickness of about 0.1 μm. The weight of the fourth conductive metal layer 34 is less than 2% (weight percentage) of the weight of the bump 35 to be formed in the protruded electrode forming process. The weight of the fourth conductive metal layer 34 can be easily controlled by changing the current conducting time and the plating current during the electrolytic plating process.

Also, as has been described above, the opening 7 provided in the resist 44 has an area greater than that of the electrode 5 (e.g., the opening has a size of φ110 μm). Therefore, since the resist 44 is used as a mask, the fourth conductive metal layer 34 has an area greater than the area of the electrode 5. In detail, when viewed as a plan view, a diameter of the fourth conductive metal layer 34 is substantially the same as a diameter of the bump 35. Also, since the first to fourth conductive metal layers 31 to 34 are laminated as a layered structure, the surface of the uppermost fourth conductive metal layer 34 will be substantially flat.

Figure 9:
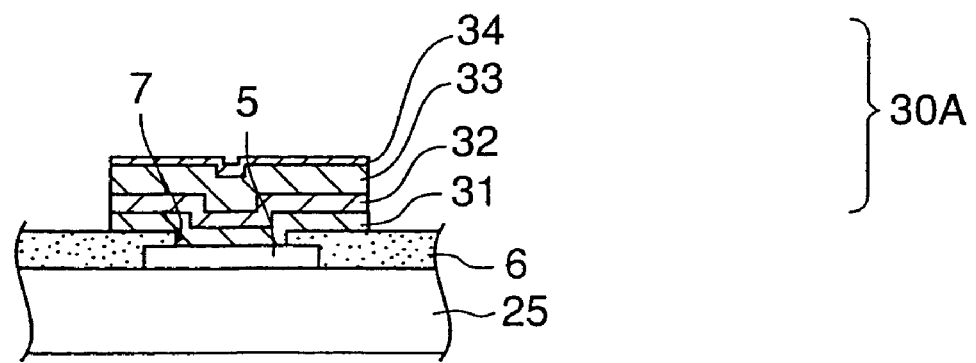

After the third and fourth conductive metal layers 33, 34 are formed in the opening 45, the resist 44 is removed. Then, unwanted portions of the first and second conductive metal coatings 41, 42 are removed by wet etching, so as to provide the first and second conductive layers 31, 32, respectively. Thus, the barrier metal 30A having a structure shown in FIG. 9 is formed.

Figure 10:
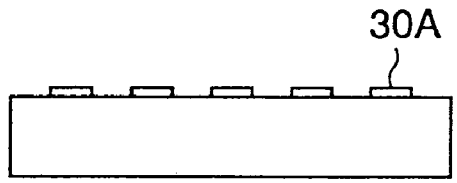
FIG. 10 is a diagram showing an individualized semiconductor chip provided with barrier metals.

In the present embodiment, after the barrier metal forming step, the wafer 25 is diced so as to be separated into individual semiconductor chips 27. FIG. 10 is a diagram showing the individualized semiconductor chip 27.

Figure 11:
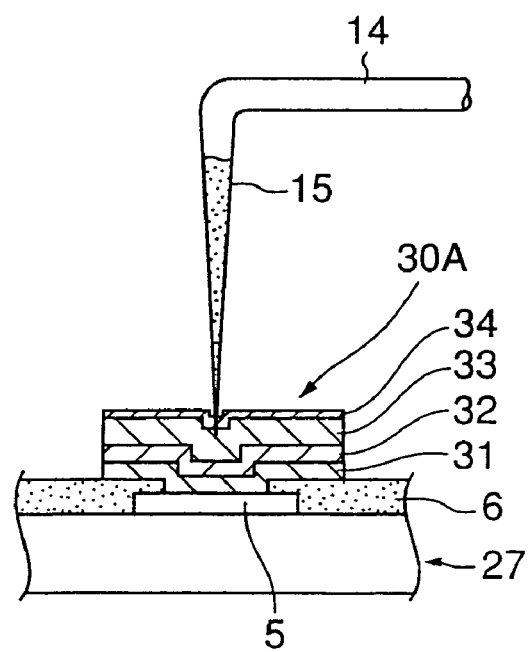
FIGS. 11 and 12 are diagrams showing how the electrical test is carried out on the semiconductor chip.
Figure 12:
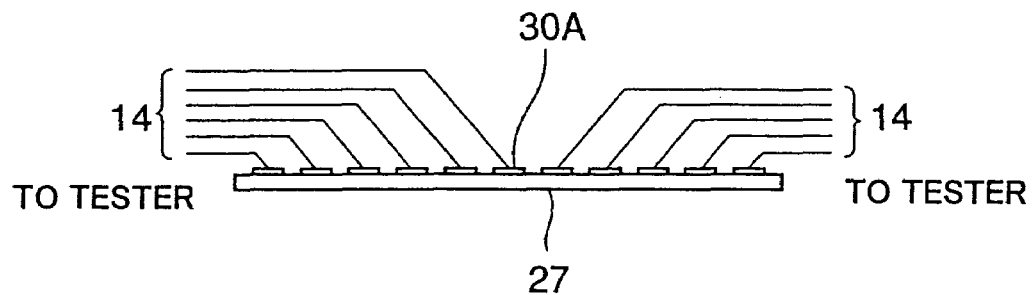
Figure 13:
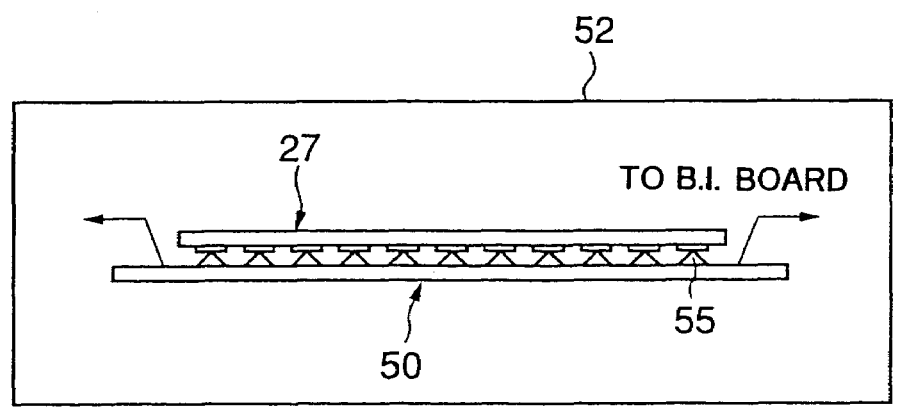
FIG. 13 is a diagram showing how the burn-in test is carried out on the semiconductor chip.

After individualizing the wafer 25 into the semiconductor chips 27, the testing step is carried out on each semiconductor chip 27. FIGS. 11 to 13 are diagrams showing the testing step.

In the present embodiment, the testing step includes an electrical test and a burn-in test. FIGS. 11 and 12 are diagrams showing how the electrical test is carried out on the semiconductor chip 27. First, a plurality of probes 14 connected to a tester is electrically connected to the semiconductor chip 27. The testing signals are supplied to the semiconductor chip 27 via the probes 14. Then, based on the output signals from the semiconductor chip 27, it is determined whether the semiconductor chip 27 is good or bad.

As shown in FIGS. 11 and 12, in the present embodiment, the probes 14 are connected to an upper part of the barrier metal 30A.

That is to say, in the present embodiment, the test step is implemented after the barrier metal forming step and before the protruded electrode forming step. Thus, at the time of implementing the testing step, the bump 35 is not yet provided on the barrier metal 30A. Therefore, the semiconductor chip 27 can be tested by directly connecting the probe 14 to the barrier metal 30A.

As has been described, the fourth conductive metal layer 34 positioned at the uppermost part of the barrier metal has a comparatively great area and is substantially flat. Therefore, the probe 14 can be more securely connected to the barrier metal 30A (the fourth conductive metal layer 34) as compared to the method of the related art in which the probe 14 is connected to the spherical bump 4 (see FIG. 3). Thus, the test can be implemented with an improved reliability.

Also, the fourth conductive metal layer 34 is made of a material having a good resistance to reaction and adhesion with the metal used for the probe 14. When the probe 14 is provided with the plated part 15, the fourth conductive metal layer 34 is made of a material having a good resistance to reaction and adhesion with the metal used for the plated part 15.

Therefore, even if the probe 14 is connected to the fourth conductive metal layer 34 and a part of the fourth conductive metal layer 34 adheres to the probe 14 (or to the plated part 15), the probe 14 and the plated part 15 will not be degraded.

Thus, since it is no longer necessary to replace expensive the probes 14 frequently, the testing cost can be reduced while increasing the reliability of the test step.

FIG. 15 is a chart showing combinations of materials of the probe 14 (or of the plated part 15, if any) and the third conductive metal layer 33, and possible materials of the fourth conductive metal layer 34. The material of the probe 14 and the material of the third conductive metal layer 33 are used as parameters for specifying the material of the fourth conductive metal layer 34. The combination of the materials of the fourth conductive metal layer 34 and the probe 14 is related to the material of the third conductive metal layer 33 which provided under the fourth conductive layer and which prevents the diffusion of the bump 35.

From FIG. 15, it can be seen that when the probe 14 (or the plated part 15) is made of palladium (Pd) and the third conductive metal layer 33 is made of nickel (Ni), a preferable material for the fourth conductive metal layer 34 is palladium (Pd) or gold (Au).

Similarly, when the probe 14 (or the plated part 15) is made of tungsten (W) and the third conductive metal layer 33 is made of palladium (Pd), a preferable material for the fourth conductive metal layer 34 is selected from a group consisting of gold (Au), silver (Ag), platinum (Pt) and rhodium (Rd).

Now, FIG. 13 is a diagram showing how the burn-in test, which is a type of a reliability test, is carried out on the semiconductor chip 27. As shown in FIG. 13, the semiconductor chip 27 is mounted on a testing card 50 and then placed in a burn-in chamber 52. Then, a heating process and a cooling process are alternately repeated. Thus, the semiconductor chips which may cause a failure due to inherent weakness or manufacturing variation will be removed. Therefore, the burn-in test may be considered as a type of a screening test.

In the present embodiment, a burn-in test at 125° C. for 48 hours is repeated twice. The test card 50 is provided with test terminals 51, such as stud bumps, and the test terminals 51 are respectively connected to the barrier metals 30A of the semiconductor chip 27.

With the testing step of the present embodiment in which the test terminals 51 are brought in contact with the barrier metals 30A, when the above-described burn-in test is implemented, an oxide layer may be produced at the surface of the fourth conductive metal layer 34. Accordingly, there is a risk that the joining property between the bumps 35 and the barrier metals 30A may be degraded.

However, in the present embodiment, since the fourth conductive metal layer 34 is made of a material having resistance to oxidization. Therefore, even if the heating process is carried out in the testing step, the oxide layer will not be formed on the surface of the fourth conductive metal layer 34. Accordingly, in the protruded electrode forming step (described later), the bump 35 can be securely joined on the barrier metal 30A (the fourth conductive metal layer 34).

After the testing step described above, the protruded electrode forming step is carried out. Solder balls of solder having a Pb/Sn ratio of 95%/5% are transferred onto the barrier metal 30A. Then, a reflow process is carried out under at 350° C. under nitrogen atmosphere. Thereby, the bump 35 having a height of about 100 μm are formed. Subsequently, processes such as cleaning the flux are implemented. Thus, the semiconductor device 20 shown in FIG. 14 is manufactured.

In the protruded electrode forming step, the reflow process (heat treatment) is implemented. However, since the fourth conductive metal layer 34 is made of a material which can be easily alloyed with the bump 35, there is a risk that the fourth conductive metal layer 34 dissolves and alloys with the bump 35.

However, in the present embodiment, the weight of the fourth conductive metal layer 34 is less than 2% (weight percentage) of the weight of the bump 35. Therefore, even if the fourth conductive metal layer 34 is entirely alloyed with the bump 35, the amount of the fourth conductive metal layer 34 in the bump 35 is considerably small. Thus, the degradation of the bump 35 can be prevented.

The fourth conductive metal layer 34 may be made of a material which can be easily alloyed with the bump 35 so as to improve the electrical connectivity and prevent the degradation of the probe 14 in the testing step. However, as has been described above, the joining force between the bumps 35 and the barrier metals 30A can be maintained due to low amount of the fourth conductive layer 34. Thus, the bumps 35 will not fall off when mounted on the semiconductor device 20, and the mounting reliability of the semiconductor device 20 can be improved.

FIGS. 16 to 19 are diagrams showing various barrier metal forming steps of a second embodiment of a method of manufacturing a semiconductor device of the present invention. In FIGS. 16 to 19, same elements as those shown in FIGS. 4 to 14 are illustrated with same reference numerals.

The present embodiment is characterized in that the barrier metal does not include the third conductive metal layer 33 of the first embodiment. In other words, the intermediate conductive layer must include one of nickel (Ni) and palladium (Pd), since those material have high diffusion protection property. However, depending on materials of other stacked layers, the intermediate conductive layer need not contain copper (Cu) which has a low diffusion protection property.

Therefore, in the present invention, the first conductive metal layer 31 is made of a material such as titanium (Ti). The second conductive metal layer 32 is made of a material such as nickel (Ni) or palladium (Pd). The fourth conductive metal layer 34 is made of a material such as gold (Au). In the present embodiment, the fourth conductive metal layer 34 is directly laminated on the second conductive metal layer 32.

Figure 16:
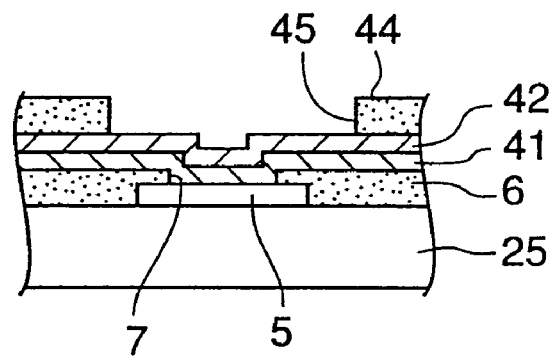
FIGS. 16 to 19 are diagrams showing various barrier metal forming steps of a second embodiment of a method of manufacturing a semiconductor device of the present invention.
Figure 17:
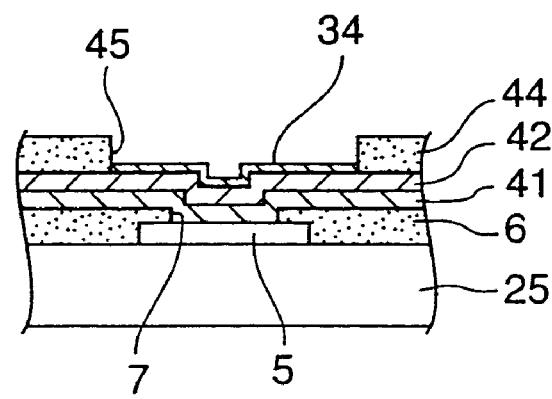
Figure 18:
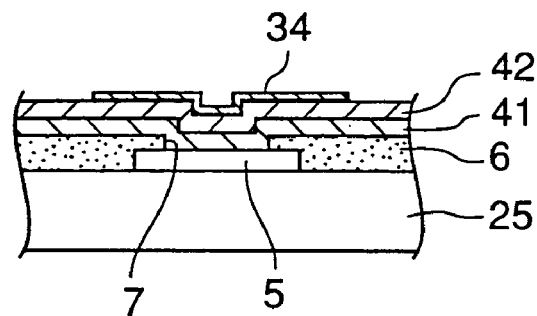
Figure 19:
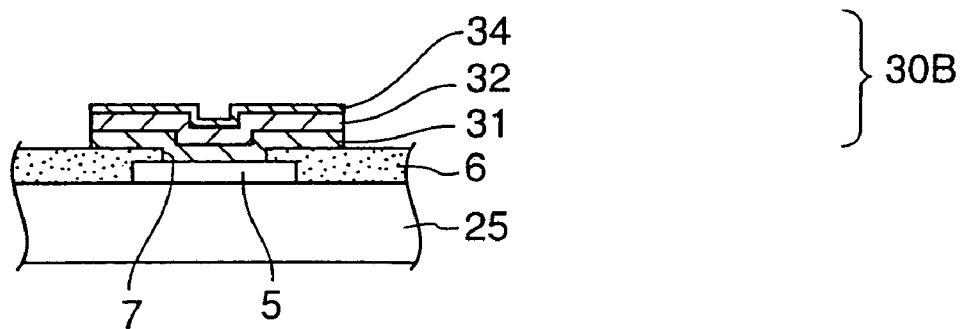

In order to manufacture the barrier metal of the present embodiment, first of all, the first and second conductive metal coatings 41, 42 are formed as shown in FIG. 16. Then, the resist 44 having openings 45 are formed on the second conductive metal coating 42. Then, as shown in FIG. 17, the fourth conductive metal layer 34 is directly formed on the second conductive metal coating 42. Subsequently, as shown in FIG. 18, the resist 44 is removed. Thereafter, the unwanted parts of the first and second conductive metal coatings 41 and 42 are removed by etching, so as to provide the first and second conductive layers 31, 32, respectively. Thus, the barrier metal 30B having a triple-layered structure shown in FIG. 19 is formed.

It can be understood that the number of layers of the barrier metal can be altered by appropriately selecting the material of each conductive metal layer. Therefore, the structure of the barrier metal is not limited to the four-layered structure of the first embodiment or to the triple-layered structure of the second embodiment, but can be a layered structure having five or more conductive metal layers. Even with the layered structure having five or more conductive metal layers, if a material of the uppermost conductive metal layer is selected to have an appropriate property with the material of the bump (protruded electrode), the testing step can be implemented before the protruded electrode forming step.

In the above-described embodiment, first, the barrier metal forming step is implemented. Subsequently, the wafer 25 is diced so as to obtain individualized semiconductor chips 27. Therefore, in the above-described embodiment, the testing step and the protruded electrode forming step are implemented on the individualized semiconductor chips 27.

However, it is inefficient to implement the testing step and the protruded electrode forming step on each one of the individualized semiconductor chips 27. Thus, dicing can be implemented not immediately after the barrier metal forming step. Instead, the testing step and the protruded electrode forming step can implemented after the barrier metal forming step. The wafer 25 can be diced thereafter.

In this manner, the testing step and the protruded electrode forming step can be simultaneously implemented on the plurality of semiconductor chips 27 formed on the wafer 25. Thereby, the manufacturing efficiency of the semiconductor devices can be improved.

Also, the protruded electrode forming step is implemented only on those semiconductor devices which have been determined as good semiconductor devices during the testing step. Thus, the bumps 35 will not be formed on bad semiconductor devices, so that a wasteful use of bump material can be avoided.

Also, the above-described steps of selectively forming the bumps 35 may be carried out in various transferring method where the bumps 35 are transferred to the individualized semiconductor chip 27. Also, when the bumps 35 are formed on an undiced wafer, if bump forming method such as metal jet method is employed, the bumps 35 may be only formed on good semiconductor chips based on the location data of bad semiconductor chips. With the metal jet method, the solder is expelled onto the wafer 25 in a similar to ink jet method, so as to form the bumps.

Further, the present invention is not limited to these embodiments, but variations and modifications may be made without departing from the scope of the present invention.

The present application is based on Japanese priority application No. 11-118543 filed on Apr. 26, 1999, the entire contents of which are hereby incorporated by reference.

What is claimed is:

1. A method of manufacturing a semiconductor device provided with first electrodes formed on a semiconductor substrate and second protruded electrodes provided on said first electrodes, respectively, said method comprising the steps of:

a) forming a barrier metal on each one of said plurality of first electrodes, said step a) further comprising the sub-steps of:

forming a first metal coating, which will become a lowermost conductive metal layer, on substantially an entire surface on said semiconductor substrate, said first metal coating having a layered structure of one or more layer having a comparatively good joining property with said first electrodes;

forming a second metal coating, which will become a part of said intermediate conductive metal layer, on said first metal coating, said second metal coating having a layered structure of one or more layer having a comparatively good joining property with said first metal coating;

forming third conductive metal layers, which will become a part of said intermediate conductive metal layer, by forming a resist provided with openings at positions corresponding to said first electrodes and having areas greater than the areas of the first electrodes, then forming third conductive metal layers in said openings such that the third conductive metal layers cover the second conductive metal layer, said third metal conductive layers having layered structure of one or more layer having a comparatively good joining property with said second metal coating and to a fourth conductive metal layers;

forming said fourth conductive metal layers, which will become an upper most conductive metal layer, on said third conductive metal layer, said fourth conductive metal layers having layered structure of one or more layer which easily alloys with the material of the second protruded electrodes and has resistance to oxidation; and forming a first conductive metal layer and a second conductive metal layer by removing said first conductive metal coating and second conductive metal coating while using the third conductive metal layer and fourth conductive metal layer as masks;

b) forming said second protruded electrodes on said barrier metals; and c) implementing one or more predetermined test on said semiconductor substrate by applying signals to said semiconductor substrate, wherein said step c) is carried out after said step a) and before said step b).

2. The method as claimed in claim 1, wherein, in said step c), the signals are supplied to the semiconductor substrate by contacting said barrier metals with probes.

3. The method as claimed in claim 2, wherein said uppermost conductive metal layer is made of a material having resistance to reaction and adhesion with a metal used for the probes.

4. The method as claimed in claim 1, wherein said uppermost conductive metal layer is made of a material which can be easily alloyed with the material of the protruded electrode and has resistance to oxidation.

5. The method as claimed in claim 1, wherein said step b) is implemented only on those semiconductor chips which have been determined as good semiconductor chips during said step c).

6. The method as claimed in claim 1, wherein a weight of the fourth conductive metal layers is less than 2% (weight percentage) of the weight of the protruded electrode.

7. The method as claimed in claim 1, wherein said first conductive metal layer is made of a metal chosen from a group consisting of titanium (Ti), chromium (Cr), molybdenum (Mo) and tungsten (W), or of an alloy containing a metal chosen from a group consisting of titanium (Ti), chromium (Cr), molybdenum (Mo) and tungsten (W).

8. The method as claimed in claim 1, wherein said second conductive metal layer is made of a metal chosen from a group consisting of copper (Cu), nickel (Ni) and palladium (Pd), or of an alloy containing a metal chosen from a group consisting of copper (Cu), nickel (Ni) and palladium (Pd).

9. The method as claimed in claim 1, wherein said third conductive metal layer is made of a metal chosen from a group consisting of copper (Cu), nickel (Ni) and palladium (Pd), or of an alloy containing a metal chosen from a group consisting of copper (Cu), nickel (Ni) and palladium (Pd).

10. The method as claimed in claim 1, wherein said fourth conductive metal layer is made of a metal chosen from a group consisting of gold (Au), platinum (Pt), palladium (Pd), silver (Ag) and rhodium (Rh) or of an alloy containing a metal chosen from a group consisting of gold (Au), platinum (Pt), palladium (Pd), silver (Ag) and rhodium (Rh).

11. The method as claimed in claim 1, wherein said protruded electrode is made of a metal chosen from a group consisting of tin (Sn), lead (Pb), silver (Ag), indium (In) and bismuth (Bi) or of an alloy containing a metal chosen from a group consisting of tin (Sn), lead (Pb), silver (Ag), indium (In) and bismuth (Bi).

* * * * *